Jan. 12, 1971 MASANOBU TSUGITA 3,555,443

STRUCTURE OF INTEGRATED CIRCUIT

Filed Nov. 26, 1968

INVENTOR.
MASANOBU TSUGITA
BY
Hopgood & Calimafde
ATTORNEYS 3,555,443

STRUCTURE OF INTEGRATED CIRCUIT

Masanobu Tsugita, Tokyo, Japan, assignor to Nippon Electric Company, Limited, Tokyo, Japan Filed Nov. 26, 1968, Ser. No. 779,058
Claims priority, application Japan, Nov. 29, 1967, 42/76,315
Int. Cl. H03f *3/11*
U.S. Cl. 330—38 2 Claims

ABSTRACT OF THE DISCLOSURE

A cascade connected integrated circuit amplifier is described wherein the ground return circuits of distinct amplifier stages are selectively sized and shaped and interconnected to a ground pad to minimize feedback effects. The ground pad may be selectively located adjacent any stage with the ground return circuits correspondingly modified in cross-section to reduce feedback effects, whether these be negative or positive. Several embodiments are described.

The present invention relates to an integrated circuit structure in general and more particularly to the interconnection of a semiconductor integrated circuit.

In the conventional semiconductor integrated circuit, most of the active and passive elements are interconnected between electrodes according to a planar circuit configuration with the interconnecting material being a conductor such as aluminum, and with the interconnection generally being isolated from the semiconductor by an oxide film such as $SiO_2$. In the case where a silicon substrate of an integrated circuit has dimensions of 1.2 mm. x 1.2 mm., for example, and where the power supply and ground lines may be longer than 1.2 mm., the interconnecting aluminum lines in many instances are designed with dimensions of the order of 20 microns in width and one micron in thickness. The impedance of the power supply and ground lines in such case is as high as a few ohms.

A multi-stage cascaded integrated circuit amplifier is generally required to have a high gain and good high-frequency characteristics. Furthermore, a preferred and convenient method of assembly of an integrated circuit reduces the number of leads of an integrated circuit packages to as small a value as is possible with, in practice, rarely allowing more than two ground and two power supply electrodes. Yet it is known that higher stability may be achieved in a multi-stage cascaded integrated circuit amplifier by designing the amplifier such that each stage forms a closed circuit. It is difficult to realize such a stable design with but two ground and power supply electrodes. With the limited number of electrodes, it is an inherent nature of the integrated circuit that the decoupling and by-passing capacitors of the power supply are all connected to one or two electrode terminals. As a result, if there is some impedance in the ground and/or power supply lines (such as the previously-mentioned several ohms), a voltage drop will be generated across said ground line and/or power supply lines due to the signal current amplified by a subsequent or output stage, producing a feed-back signal to the input stage. If the feed-back is positive, the stability of the circuit is poor and oscillation may result. If the feed-back is negative, the gain of the circuit decreases. The higher the gain of the amplifier, the more feed-back effect the circuit encounters. Therefore:

It is an object of the present invention to provide a semiconductor integrated circuit with a high quality.

It is another object of the present invention to provide a semiconductor integrated circuit with a low ground line impedance.

It is a further object of the present invention to provide a structure of semiconductor integrated circuit wherein feed-back from the output stage to the input stage is significantly reduced.

It is a still further object of the present invention to provide a structure of semiconductor integrated circuit for amplifying the same frequency band in each stage with such an electrode and circuit interconnection that the most amplified signal current in a closed circuit hardly affects the preceding stages.

The above-mentioned and other features and objects of this invention and the manner of attaining them will become more apparent and the invention itself will best be understood by reference to the following description of embodiments of the invention taken in conjunction with the accompanying drawings, the description of which follows:

FIGS. 1*a*–1*c* are circuit diagrams showing the structure in accordance with the present invention;

Figure 1A:
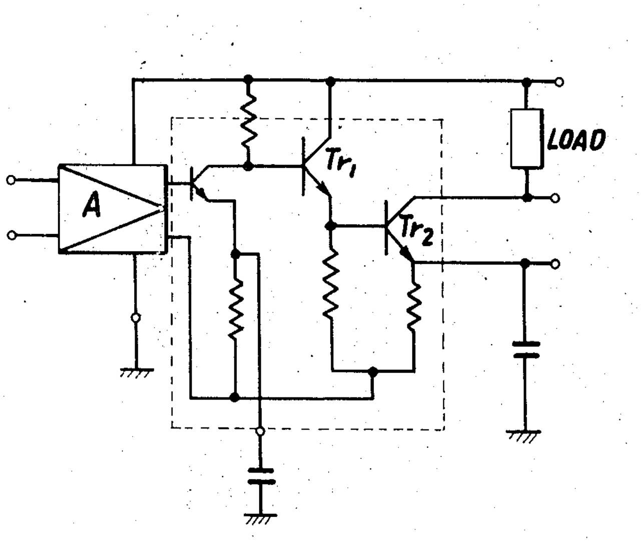
Figure 1B:
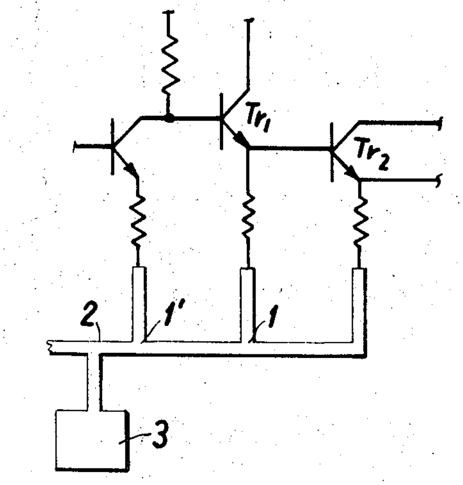
Figure 1C:
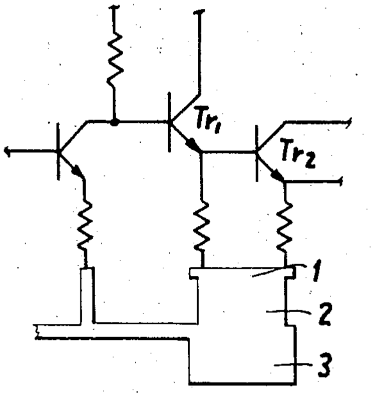

The present invention will be hereinafter described referring to the accompanying drawings. FIGS. 1*a* through 1*c* show an embodiment of the present invention wherein FIG. 1*a* is a circuit diagram of a general purpose amplifier, showing in particular the details of the output stage; FIG. 1*b* shows a possible interconnection for the ground line of a conventional integrated circuit of the amplifier shown in FIG. 1*a*, particularly the portion contained by a dotted line; and FIG. 1*c* shows an interconnection for the same circuit according to the present invention. In FIG. 1*b*, intersections 1 and 1′ are the points where ground lines of the amplifying stage intersect the common ground line 2 wherein all ground current of each of the amplifying stages flows through the common line 2, and a pad 3 is provided for external connection. In the case where the ground terminal (e.g. emitter terminal) of the amplifying element (transistor) of each stage is directly grounded, the ground terminal of the element is interconnected to the ground point by a conductor such as aluminum, and in the case where the ground terminal is grounded D.C.-wise through a resistor and A.C.-wise through a by-passing capacitor, the opposite terminal of the resistor and the ground point are connected with a conductor such as aluminum. At any rate, the common ground line and the pad are of the same conductor material.

In FIG. 1*c*, a ground point 1 of the output stage is disposed closest to a pad 3 and a common ground line 2 is so designed as to minimize the resistance thereof as much as possible, thus minimizing the feed-back from the output stage to the preceding stages. Likewise in a series cascaded integrated circuit the input of the output stage is in many cases connected to a collector grounded circuit for impedance matching, wherein the emitter signal current of the collector grounded stage is in the same phase as the emitter current of the following output stage wherein the latter current has a significantly high value. In such a circuit the feed-back effect may be reduced by so disposing the opposite terminals of the low value resistors which are in series with the emitter terminals of the collector grounded stage and output stage that those terminals are closer to the pad than the ground point of the preceding stage.

Figure 2:
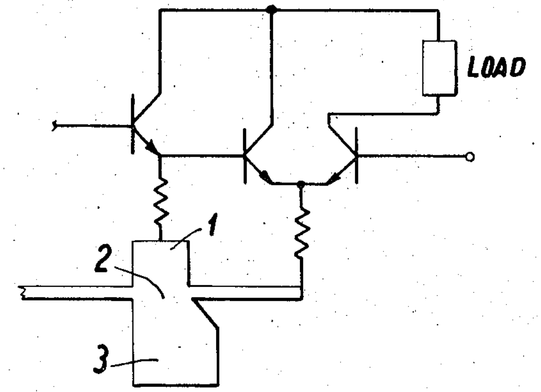
FIG. 2 is a circuit diagram of an embodiment of the present invention.
Figure 4:
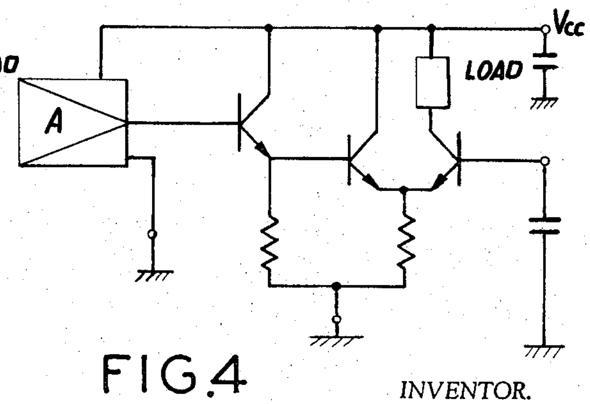

If the output stage is a differential amplifier as shown in FIG. 4, the differential amplifier itself is effectively a closed circuit. Therefore, the feed-back effect in such an amplifier is not significant, but such feed-back is important to a collector A.C. grounded stage, which is usually connected to the input of said differential amplifier, with large signal current through the emitter of the collector grounded stage in comparison with the signal current of the differential output stage. Impedance in the ground line common to the differential output stage and that of the preceding stage would produce feed-back to said preceding stage in the manner as explained before. Therefore, with reference to FIG. 2 and the circuit configuration of FIG. 4, the ground point 1 of the collector ground stage is arranged so as to be shorter than the ground point of the other stage in the common ground line, and the width of the line 2 is made broader so as to reduce the line impedance.

Figure 3:
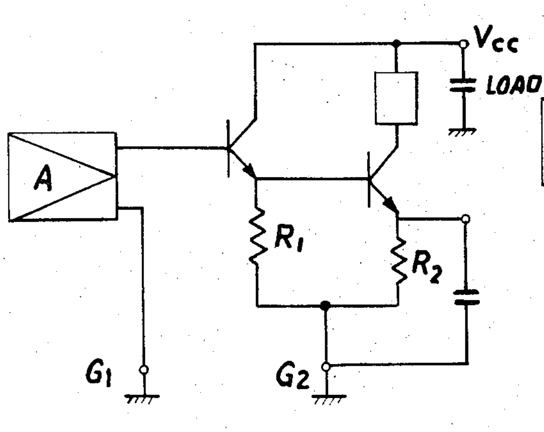
FIGS. 3 and 4 are circuit diagrams of other embodiments of the present invention.

A further embodiment of the present invention is illustrated in FIG. 3. Among conventional integrated circuits several are known to have dual ground terminals (external leads) wherein a common ground line connects the dual ground terminals to each other. In most applications the external ground terminals are short-circuited on the printed circuit board with low resistivity material. Any impedance in the common ground line and bonding pad within the integrated circuit is likely to cause feed-back and instability of the circuit, as described previously. As shown in FIGS. 3 and 4, on the contrary, the circuit instability due to feed-back may be significantly reduced by separating the external ground line for the output stage from that of the preceding stage, and short-circuiting them on the outside printed circuit board (provided there is a collector grounded circuit for connecting a preceding stage such as A to an output stage, and where a ground point of the output stages includes the ground of said collector ground circuit). This latter circuit design is particularly useful for a high gain amplifier. It is also effective for an integrated circuit that has intermetallic compounds in its interconnection system, for example aluminum metallization with gold lead wires. The latter interconnection forms a compound known as the purple plague and especially at elevated temperatures, when the resistivity of the compound is high, the undesirable feed-back as described before arises.

The present invention with its selected sizing of ground returns provides an integrated circuit with a stable performance, and an improvised high-quality yield in integrated circuit production.

Although specific configurations of the present invention are disclosed in the description herein, it will be understood that the embodiments are for purposes of clarifying the disclosure only, and are not to be interpreted as any limitation on the scope of the present invention. Therefore, it will be appreciated that variations of the present invention will be apparent to those skilled in the art.

I claim:

1. A semiconductor integrated circuit device having an amplifier comprising a plurality of cascade-connected transistor amplifier stages operable at substantially the same frequency range, said device comprising a connecting ground pad, ground lines connected to said ground pad and to the ground circuit of each of said stages, the ground lines of the final two of said amplifier stages being formed of a single and common conducting region wider than the ground lines connected to the corresponding ground circuits of the others of said amplifier stages, said wider conducting region being directly connected to said connecting ground pad and substantially integrated therewith.

2. A semiconductor integrated circuit device having an amplifier comprising a plurality of cascade-connected transistor amplifier stages and a differential amplifier as final stage operable at substantially the same frequency range, said device comprising a connecting ground pad, ground lines connected to said ground pad and to the ground circuit of each of said amplifier stages, the ground line of the amplifier stage immediately preceding said differential amplifier being formed of a conducting region wider than the ground lines connected to the corresponding ground circuits of said amplifier stages other than said immediately preceding stage, said wider conducting region being directly connected to the connecting ground pad and substantially integrated therewith.

References Cited

UNITED STATES PATENTS

| | | | |
|---|---|---|---|
| 3,355,669 | 11/1967 | Avins | 307—303X |
| 3,418,592 | 12/1968 | Solomon et al. | 330—38X |
| 3,421,103 | 1/1969 | Nolde | 330—38X |

OTHER REFERENCES

Cohen: "Sony Scores With IC for Small Radio," Electronic, Apr. 3, 1967, pp. 177–179.

France: "The Design of Thin-Film Microcircuits," British Communications and Electronics, January 1965, pp. 30, 31.

ROY LAKE, Primary Examiner

J. B. MULLINS, Assistant Examiner

U.S. Cl. X.R.

307—303